United States Patent [19]

Kaneko et al.

[11] Patent Number: 4,779,234
[45] Date of Patent: Oct. 18, 1988

[54] FIRST-IN-FIRST-OUT MEMORY CAPABLE OF SIMULTANEOUS READINGS AND WRITING OPERATIONS

[75] Inventors: Katsuyuki Kaneko, Osaka; Masaru Uya, Hirakata; Yoshito Nishimichi, Moriguchi, all of Japan

[73] Assignee: Matsushita Electric Industrial Co., Ltd., Osaka, Japan

[21] Appl. No.: 866,963

[22] Filed: May 27, 1986

[30] Foreign Application Priority Data

May 27, 1985 [JP] Japan .................... 60-113418

[51] Int. Cl.[4] .............................................. G11C 7/00
[52] U.S. Cl. ................................... 365/221; 365/189
[58] Field of Search ............... 365/221, 189, 230, 78, 365/190; 364/200 MS File, 900 MS File

[56] References Cited

U.S. PATENT DOCUMENTS

| | | | |
|---|---|---|---|
| 4,415,994 | 11/1983 | Ive et al. | 365/189 |
| 4,433,394 | 2/1984 | Torii et al. | 365/221 |
| 4,507,760 | 3/1985 | Fraser | 365/221 |
| 4,535,427 | 8/1985 | Jiang | 365/190 |
| 4,541,076 | 9/1985 | Bowers et al. | 365/190 |
| 4,616,338 | 10/1986 | Helen et al. | 365/189 |

*Primary Examiner*—Stuart N. Hecker
*Assistant Examiner*—Glenn A. Gossage
*Attorney, Agent, or Firm*—Wenderoth, Lind & Ponack

[57] ABSTRACT

A FIFO memory using one of the ports of a RAM having two or more ports for writing and another port for reading is disclosed. Writing into the FIFO memory is done instantly, while reading from the FIFO memory is effected by holding the output of the preliminarily accessed RAM until the end of a reading operation. The output of the RAM is updated by a request from outside and according to the state of the FIFO memory, and this operation is done simultaneously with reading or writing.

2 Claims, 3 Drawing Sheets

019
FIRST-IN-FIRST-OUT MEMORY CAPABLE OF SIMULTANEOUS READINGS AND WRITING OPERATIONS

BACKGROUND OF THE INVENTION

This invention relates to a first-in-first-out memory, or FIFO memory, which reads out the data in the sequence of being written in.

The FIFO memory is a device for temporarily storing data without disturbing the sequence of arrival of a signal train when the input time of a signal train from outside is different from its processing time. In the conventional FIFO memory, the following two constructions are known.

In the first construction, data circulates along a stack of registers. In this setup, it is possible to maintain a perfect asynchronism between writing and reading. However, in this construction, if the accumulation capacity is increased, the time to go from input to output becomes longer, and a greater number of elements are necessary to make up the structure, so that the storage capacity is rather limited by these factors.

The second construction is intended to realize an FIFO memory by a random access memory (RAM) and control circuit. In this setup, the accumulation capacity can be substantially increased, but it is difficult to maintain a perfect asynchronism between writing and reading. To overcome this difficulty, it is proposed to adjust the access to the RAM by the cascade connection of a plurality of buffer registers to the input and output of a RAM, (see, e.g. U.S. Pat. Nos. 4,616,338 by Andre Helen et al. or 4,415,994). In this construction, data is written into the input buffer. Later, after acknowledging that the RAM is accessible, this data is transferred into a specified address of the RAM from the input buffer. The data is read out from the output buffer. The data of the output buffer is, after acknowledging that the RAM is accessible prior to this reading operation, transferred from the specified address of the RAM into the output buffer. Usually, this operation is done in synchronism with the clock. If access to the RAM for writing and access to the RAM for reading occur simultaneously, the RAM is sequentially accessed according to the determined procedure.

Thus, by installing buffer registers at the input and output of the RAM, if a write request and a read request should occur simultaneously, the access to the internal RAM is adjusted by the control circuit, and the RAM is accessed sequentially, thereby realizing an FIFO memory which appears to act asynchronously as seen from the outside.

Such constructions require plural buffer registers, aside from the RAM main body, and the control of these registers is complicated. Besides, since the time of storing data in buffer register and the time of writing the data in the RAM or reading the data out of the RAM are different, if there is possibility of consecutive write requests and read requests, it is necessary to install write buffer registers or read buffer registers by the number of assumed continuous requests. In this case, more hardware and a more complicated register control than that mentioned above become necessary.

SUMMARY OF THE INVENTION

It is hence a primary object of this invention to present an FIFO memory capable of processing, without using buffer registers, a write request and a read request if occurring simultaneously.

It is another object of this invention to present an FIFO memory capable of performing at high speed during writing or reading.

These and other objects are accomplished by a first-in-first-out memory which comprises a random access memory including a first input and output means capable of at least writing, a first address input means corresponding to this first input and output means, a second input and output means capable of at least reading independently of the first input and output means, a second address input means corresponding to the second input and output means, and a memory cell array which is operated by the first and second input and output means and the first and second address input means; and an operation control circuit of the random access memory including a first control circuit which controls a write address signal to be applied into the first address input means according to a write request from outside, and a second control circuit which controls a read address signal to be applied into the second address input means according to a read request from outside.

From the operation control circuit, if a write address signal and a read address signal are simultaneously delivered, and these address signals are simultaneously applied to the memory cell array through the first and second address input means of said random access memory, data writing action into the memory cell array and data reading action from the memory cell array are effected simultaneously.

In a specific embodiment, the first and second input and output means are first and second bit lines individually connected to memory cells which make up the memory cell array. The first address input means is a write address decoder, and second address input means is a write address decoder. The first control device is a write address control circuit, and second control device is a read address control circuit.

The first-in-first-out memory may further include an accumulation circuit to hold the output of random access memory while the random access memory is processing to read out according to said read request. The accumulation circuit may include a latch circuit which holds the data according to a read signal.

The operation control circuit may further include a third control circuit which detects whether said random access memory is full or empty, from a write request from outside and the output of said first control device, and a read request from outside and the output of said second control device, and sends out an update signal to said output control device. The third control circuit comprises a comparator circuit which compares the contents of write address register and read address register, and a control circuit which receives a signal from this comparator circuit, a write request signal and a read request signal, and applies an update signal to the output control device.

The random access memory may further include an output control circuit to control the signals delivered from the second input and output means. The output control circuit comprises an output data updating circuit which updates the signal delivered from said second input and output means into an accumulation content corresponding to the signal applied to said second address input means by an update signal, and an accumulation circuit which holds the previous value of the output of the random access memory while the output data updating device is operating.

According to the present invention as described herein, the following benefits, among others, are obtained:

(1) If a read request and a write request occur simultaneously, these requests can be processed at the same time in the RAM, and the construction of the FIFO memory may be simplified without requiring any particular buffer registers.

(2) Therefore, the operating speed of reading and writing is increased.

While the novel features of the invention are set forth with particularity in the appended claims, the invention, both as to organization and content, will be better understood and appreciated, along with other objects and features thereof, from the following detailed description taken in conjunction with the drawings, in which:

DESCRIPTION OF THE PREFERRED EMBODIMENTS OF THE INVENTION

Figure 1:
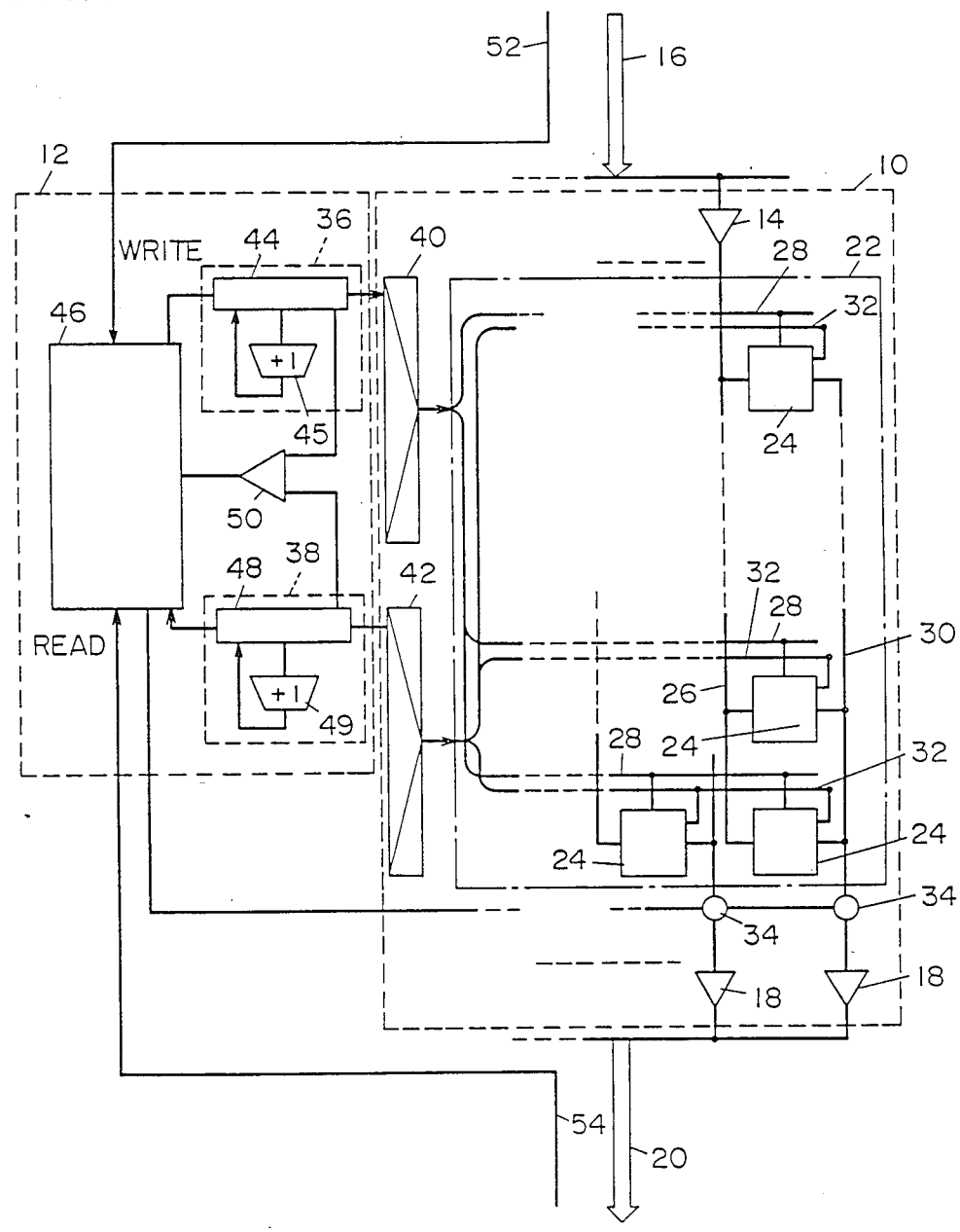
FIG. 1 is a block diagram showing a schematic construction of a FIFO memory in one of the embodiments of this invention.

The invention is described below by referring to the drawings which represent one of its embodiments. FIG. 1 is a block diagram showing an embodiment of the FIFO memory of this invention, in which element 10 is a random access memory (RAM), and element 12 is its operation control device. This RAM 10 is a two-port RAM, and its one port, input port 14, is connected to an input line 16, and its other port, output port 18, is connected to an output line 20. Memory cells 24 in a memory cell array 22 are connected to bit lines 26 and word lines 28 corresponding to the input port 14, and bit lines 30 and word lines 32 corresponding to the output port 18. The data on the bit lines 30 are updated to data corresponding to the contents of the memory cells 24 corresponding to the selected work lines 32, by an output control device 34, and are delivered to the output line 20 through the output port 18. Writing into and reading out of the memory cell array 22 is effected by decoding the write and read addresses generated by a write address control circuit 36 and a read address control circuit 38, by means of a write address decoder 40 and read a address decoder 42, and by selecting one of the word lines 28 and 32, respectively. The write address control circuit 36 has a write address register 44 and an incremental circuit 45 which updates according to the address update request from a control circuit 46. The read address control circuit 38 has a read address register 48 and an incremental circuit 49 which updates according to the address update request from the control circuit 46.

The control circuit 46 receives a signal from a comparator circuit 50 which compares the contents of the write address register 44 with the read address register 48, a write request signal from a write request signal line 52, and a read request signal from a read request signal line 54, and generates and supplies an update signal to the write address control circuit 36 and the read address control circuit 38, a control circuit of the RAM 10, and an update signal to the output control device 34.

In the construction in FIG. 1, when a write request is generated from the signal line 52, the control circuit 46 checks to see if the RAM 10 is full or not, and instantly writes the data on the input line 16 into the memory cell array 22 through input port 14. However, when the RAM 10 is full, the write request is ignored. On the other hand, if a read request is generated from the signal line 54, the control circuit 46 checks to see if the RAM 10 is empty or not, and instantly sends out the output data of output port 18 onto the output line 20. At the same time, the memory cell 24 to be read out next is selected through the read address control circuit 38, the read address decoder 42, and the word line 32, and the accumulation content of the memory cell 24 updated by the output control circuit 34 which is operated by the update signal sent out from the control circuit 46 is delivered onto the bit line 30. This data is sent out onto the output line 20 by way of the output port 18 when a next read request is generated. However, if the control circuit 46 detects an empty state of the RAM 10, this read request is ignored. The output control circuit 34 updates the data on the bit line 30 in the following case. That is the case in which a read request is issued and it is ready to read, or a write request is issued while the RAM 10 is empty. The former is the normal reading process, and the latter is the process when it is necessary to transfer the written data immediately onto the bit line 30 because the RAM 10 is empty.

Figure 2:
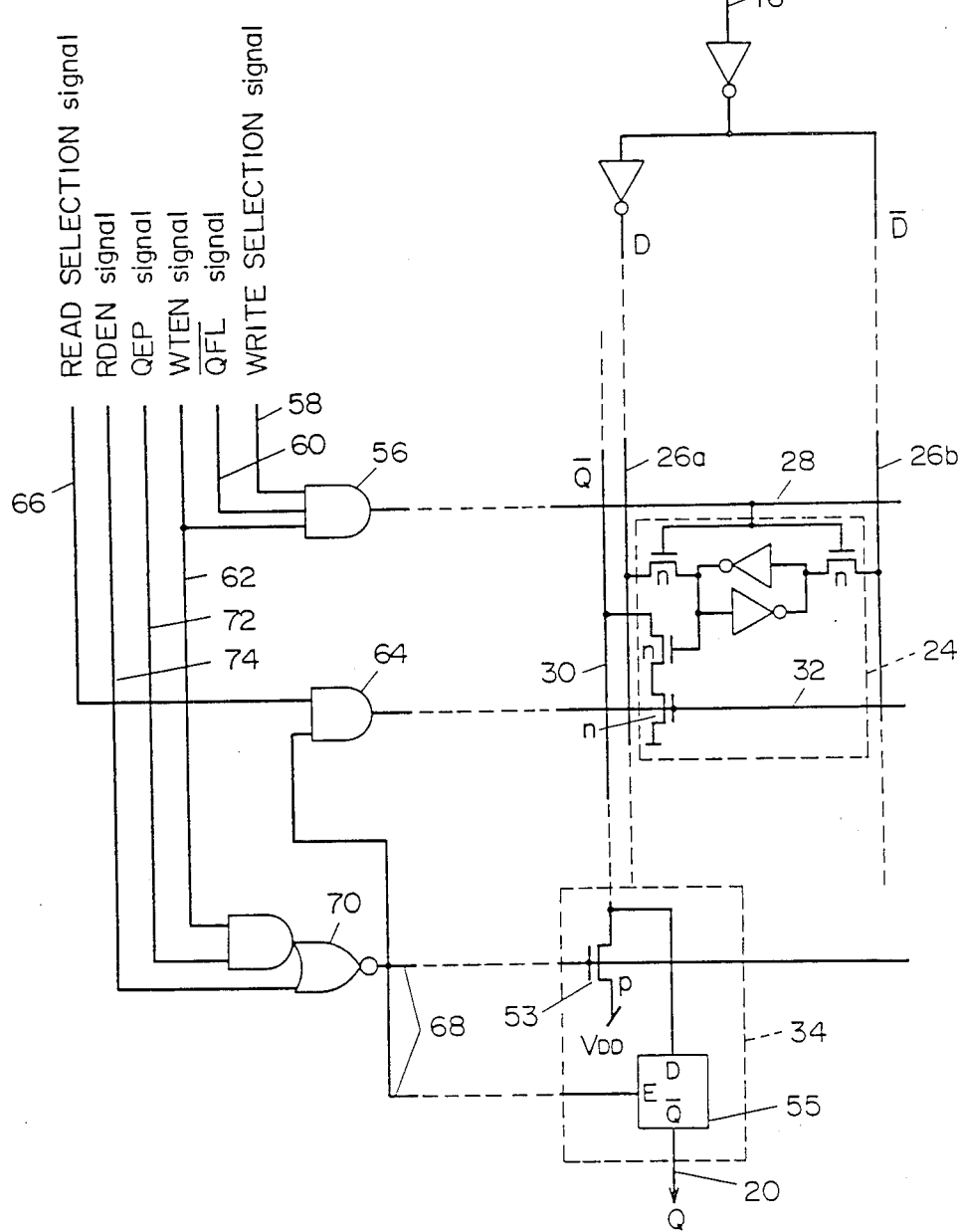
FIG. 2 is a circuit diagram for describing the practical organization of the same FIFO memory, especially the relationship between the circuit for controlling the write/read operations and the memory cells.
Figure 3A:
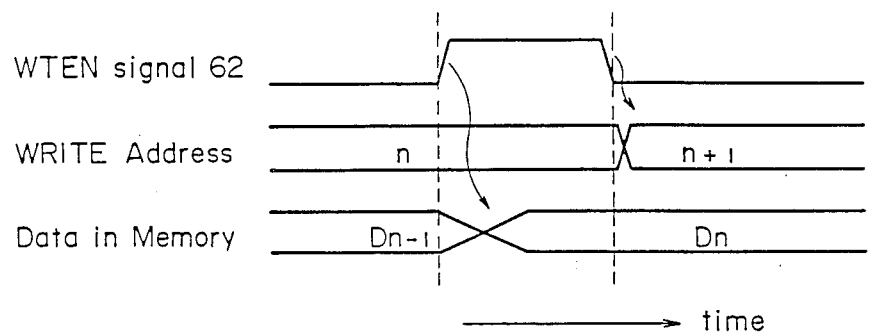
FIGS. 3(a)-3(b) present waveform diagrams of principal signals of the same FIFO, FIG. 3 (a) being a waveform diagram at the time of data writing and FIG. 3(b) being a waveform diagram at the time of data reading.
Figure 3B:
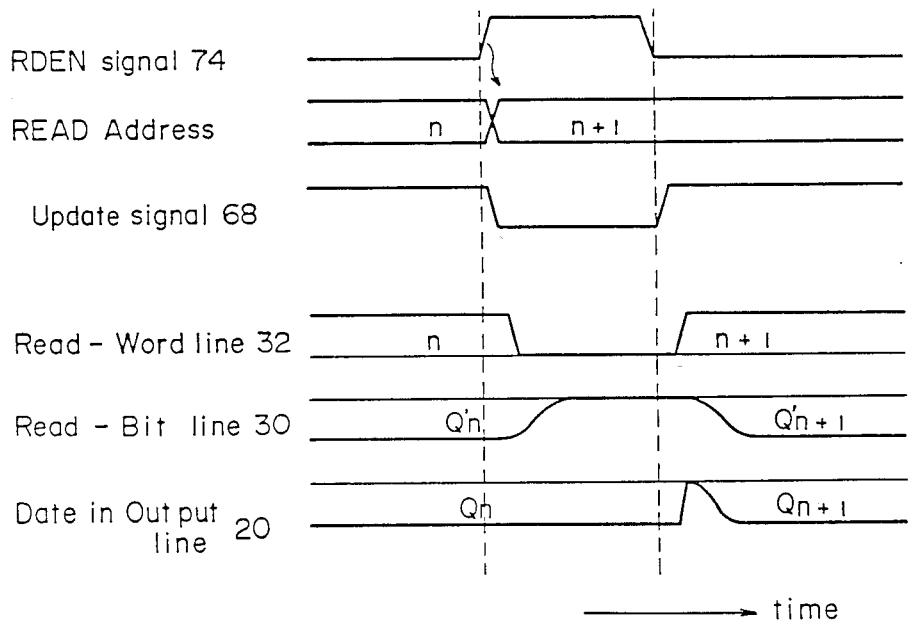

For easier understanding, a more practical construction example composed of the RAM 10, the input port 14, the output port 18, the output control circuit 34, part of the write address decoder 40, part of the read address decoder 42, and part of the control circuit 46 is shown in FIG. 2, and its operation is described in FIG. 3. In FIG. 2, the same numbers are given to the parts corresponding to those described in FIG. 1. Incidentally, the bit line 26 in FIG. 1 is the two complementary bit lines 26a and 26b in FIG. 2. The memory cell 24 is a normal static memory cell connected to the bit lines 26a and 26b and the word line 28, being furnished with an exclusive circuit of an open drain type composed of two N-type MOS transistors is connected to the bit line 30 and word line 32. The output control device 34 is composed of a P-type MOS precharge transistor 53 connected to the bit line 30 and a latch circuit 55. A gate 56 sends out, to the word line 28, the AND combination of a write selection signal 58 from the address control circuit 36, a QFL signal 60 to show that the RAM 10 is not full, and a write enable signal (WTEN) 62. Similarly, a gate 64 sends out, to the word line 32, the AND combination of a read selection signal 66 and a signal on an update signal line 68 mentioned below. Also, a gate 70 sends out, to an update signal line 68, the NOT OR combination of the read enable signal (RDEN) 74, and the AND combination of the WTEN signal 62 and QEP signal 72 to tell that the RAM 10 is empty. It is assumed that the WTEN signal 62 and the RDEN signal 74 are given in positive pulses, or that they are shaped in positive pulses, and the width of the pulses should be at least longer than the time required for accessing the memory cell array 22.

In the construction shown in FIG. 2, the operation at the time of generation of a write request is explained while referring also to FIG. 3 (a). When the WTEN signal 62 is generated, if the RAM 10 is not full, that is, if the $\overline{QFL}$ signal 60 is "1" logic, the word line 28 is selected through the gate 56, and is immediately written into the memory cell indicated by the write address. The write address is updated by the trailing edge of the WTEN signal 62, to be ready for processing of a subsequent write request.

On the other hand, the operation at the time of generation of a read request is explained together with FIG. 3 (b). Before a read request occurs, the read address indicates the address corresponding to the data to be delivered next, and the word line corresponding to this read address has been selected, and the bit line 30 and output line 20 maintain the data corresponding to this read address. When the RDEN signal 74 occurs, an update signal 68 of a reverse polarity of this signal is generated, and the data on the bit line 30 is held in the latch 55 at the leading edge of this pulse. This data is held in the latch 55 up to the trailing end of the pulse of update signal 68, and is read out, in this period, as the output of the FIFO memory from outside. By the leading edge of the RDEN signal 74, the read address is updated. During the period of the pulse of the update signal 68, the bit line 30 is precharged, and the word line 32 is not selected. After the update signal 68, the precharge of bit line 30 is finished, and the word line 32 corresponding to the updated read address is selected, and new data appears on the bit line 30. At the same time, the latch 55 is released, and the data to be read out next is prepared on the output line 20. If a write request is issued while the RAM 10 is empty, since it is necessary to read out the written data immediately, the above write processing and read processing are done simultaneously. That is, in the pulse period of the WTEN signal 62, the data is written by way of bit lines 26a and 26b, and the update signal 68 is generated at the same time to precharge the bit line 30, thereby controlling the latch circuit 55. At this time, not to mention, the read address is not updated, and the word line 32 corresponding to the address before the onset of the write request is selected again.

When the write request and the read request are fed simultaneously, both requests are processed at the same time. In this case, it is inconvenient only when the RAM 10 is empty, but usually, since such a read request is meaningless, it is possible to process properly in the control circuit 46.

Thus, by this invention, it is possible to realize a FIFO memory having a large accumulation capacity and requiring no particular time relationship between reading and writing. Furthermore, this FIFO memory is simple in composition and easy in control, and a clock is not needed. Such advantages are particularly useful when installing a FIFO memory of large scale or small scale on an LSI device.

This invention is not limited to the above embodiment alone, but multiple modified versions are possible. In particular, many versions may be considered for the construction of a two-port memory. Also, many different versions and additional functions are possible for the construction of the control circuit, the construction of the output control circuit, and the generating method of the update signal. The essence of this invention is that the normal operation is guaranteed if the write request and read request are issued in any mutual relationship by the functions of the two-port memory and the output control device connected thereto. The scope of this invention is extended to applications to all devices having similar constructions, generally.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What we claim is:

1. A first-in-first-out memory comprising:

a random access memory having an input and an output, said random access memory including data input means, first address means for directing data through said data input means to memory cells, data output means capable of operating independently from said data input means, second address means for directing data through said data output means from memory cells, a memory cell array being comprised of a plurality of memory cells which are directed by said first address means and said second address means independently, and an output control circuit for controlling the data supplied from said data output means, and said output control circuit including an output data updating circuit for updating the data supplied from said data output means into the data of the memory cell directed by said second address means when said update signal comes, and an accumulation circuit for holding the previous data of said random access memory while said update sign is varied; and an operation control circuit for said random access memory, said operation control circuit including a first control circuit for generating a write address signal to be applied to said first address means in accordance with an external writing signal, a second control circuit for generating a read address signal to be applied to said second address means in accordance with an external reading signal, and a third control circuit for detecting whether said random access memory is full or empty from the output of said first control circuit, the output of said second control circuit, an external writing signal and an external reading signal and for sending an update signal to said output control circuit when an external reading signal comes or when an external writing signal comes as said random access memory is empty.

2. A first-in-first-out memory of claim 1, wherein said output data updating circuit comprises a precharge circuit coupled to the data output means and operated by the update signal, and said accumulation circuit comprises a latch for latching the previous data of the random access memory while said update signal is valid

* * * * *